(12) United States Patent
Oh

(10) Patent No.: US 7,372,752 B2
(45) Date of Patent: May 13, 2008

(54) TEST MODE CONTROLLER

(75) Inventor: Seung-Min Oh, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/529,274

(22) Filed: Sep. 29, 2006

(65) Prior Publication Data

US 2007/0070742 A1 Mar. 29, 2007

(30) Foreign Application Priority Data

Sep. 29, 2005 (KR) ............... 10-2005-0091660
Mar. 31, 2006 (KR) ............... 10-2006-0029650

(51) Int. Cl.
*G11C 11/00* (2006.01)
(52) U.S. Cl. .................... 365/201; 365/191
(58) Field of Classification Search ........... 365/201, 365/191
See application file for complete search history.

(56) References Cited

U.S. PATENT DOCUMENTS

| 6,046,947 | A | 4/2000 | Chai et al. |
| 6,949,947 | B2 | 9/2005 | Jung |
| 2005/0138502 | A1 | 6/2005 | Jung |
| 2005/0207245 | A1 | 9/2005 | Kang |
| 2007/0018677 | A1* | 1/2007 | Marr ........................ 324/765 |
| 2007/0076495 | A1* | 4/2007 | Mochida et al. ............ 365/201 |
| 2007/0162799 | A1* | 7/2007 | Kamada ..................... 714/724 |

FOREIGN PATENT DOCUMENTS

| JP | 2001-210099 | 8/2001 |
| KR | 10-2000-0055257 | 9/2000 |
| KR | 10-2003-0051030 | 6/2003 |

* cited by examiner

*Primary Examiner*—Michael T Tran
(74) *Attorney, Agent, or Firm*—McDermott Will & Emery LLP

(57) ABSTRACT

A test mode controller is capable of reducing a chip area and unnecessary current consumption by integrally constructing latch units of the two test circuits. The test mode controller includes a test control block for determining a test mode between a programmable test and a wafer burn-in test to generate a reset signal and a control signal generating block for receiving a plurality of input signals activated in a wafer burn-in test to generate a plurality of test control signals in response to the reset signal and a programmable test signal activated in a programmable stress test.

20 Claims, 5 Drawing Sheets

TEST MODE CONTROLLER

FIELD OF THE INVENTION

The present invention relates to a test mode controller; and, more particularly, to a test mode controller capable of reducing a chip area and current consumption by integrally constructing circuitry for performing a wafer burn-in test and a programmable stress test for testing the reliability.

BACKGROUND

In general, tests are mainly classified into two types, i.e., product tests and prove (or function) tests. The product test screens for product failures and sorts out articles of good quality from defects that can occur during wafer-processing, an assembly process, etc.

The prove test confirms whether or not the function or performance of a manufactured DRAM meets design specification. The product test is frequently performed during a shipping process, and thus there is required high throughput in the product test. The purpose of the prove test is to shorten a development period and raise the completion degree of the product by thoroughly carrying out the prove test in a research and development period.

If finding out the defects occurring during manufacturing processes by means of the product test, or finding out that the function of the actual product does not meet with the design specification, a predetermined analysis such as a failure analysis is performed for accurately diagnosing reasons for failure. In particular, it is important to diagnose where the defects occur in the DRAM beyond question.

The DRAM test measures three kinds of characteristics, i.e., DC, AC and function, by using a measurement system such as a memory test. As one part of the function test, a burn-in test is performed after a semiconductor chip is packaged. The burn-in test is performed such that excessive stress is exerted upon the whole DRAM. That is, a voltage and an ambient temperature higher than for conditions of actual use are imposed upon the DRAM in order to find out initial defects in its early stages.

The cells sorted out as defects through the test may be repaired for performing normal operations. In other words, the defective cells are replaced with redundancy cells. Furthermore, a predetermined operational condition, which is arbitrarily set using experimental data, is applied to the passed cells sorted out through the test during DRAM operation.

However, if there is a significant number of detects corresponding to several bits or higher, it is impossible to repair the wafer chip. Thus, this chip cannot be used. As a result, the package cost of the chip and the time for the burn-in test after packaging have been unnecessarily consumed.

In addition, this problem may becomes more serious in a highly integrated device so that the burn-in test becomes more and more important in order to accurately detect the defective cells vulnerable to the wafer burn-in test before the package process. In the wafer burn-in test, it is important to appropriately exert the stress on a portion where the defect may occur in adjacent cells.

FIG. 1 is a block diagram of a conventional circuit for a wafer burn-in test.

The circuit for the wafer burn-in test includes a decoder 10, a wafer burn-in reset (WBI) unit 20, a trigger generation unit 30, and a plurality of latch units 40 to 46.

The decoder 10 decodes input signals WA<9>, WA<10> and WA<11> to output test mode setting signals TDCOFF, TAWL, TEWL, TOWL, T2RBE, T2RBO and TSAE. The WBI reset unit 20 outputs a wafer burn-in reset signal RESETB in response to the output of the decoder 10 or a power-up signal PWU_B of an initial operation. The trigger generation unit 30 outputs a trigger signal TRIGP in response to an input signal WA<8>.

In addition, the plurality of latch units 40 to 46 latch the test mode setting signals TDCOFF, TAWL, TEWL, TOWL, T2RBE, T2RBO and TSAE in response to the wafer burn-in reset signal RESETB and the trigger signal TRIGP, to thereby output test mode control signals TDCOFFW, TAWLW, TEWLW, TOWLW, T2RBEW, T2RBOW and TSAEW.

FIG. 2 is a circuit diagram of the latch unit 40 to 46 of FIG. 1. Herein, the structures of all the latch units 40 to 46 are identical to one another so that description will be only focused on one latch unit 40, for example.

The latch unit 40 includes NAND gates ND1 to ND3 and inverters INV1 and INV2. The NAND gate ND1 performs a NAND operation on input signals IN1 and IN2. Herein, the input signals IN1 and IN2 denote the test mode setting signal TDCOFF and the trigger signal TRIGP, respectively.

The NAND gates ND2 and ND3 form a latch circuit. That is, the output of the NAND gate ND2 is input through one terminal of the other NAND gate ND3, and vice versa. The NAND gate ND2 performs a NAND operation on the output of the NAND gate ND1 and the output of the NAND gate ND3. The NAND gate ND3 performs a NAND operation on the output of the NAND gate ND2 and wafer burn-in reset signal RESETB. The inverters IV1 and IV2 delay the output of the NAND gate ND2 to output the output signal OUT. Herein, the output signal corresponds to the test control signal TDCOFFW.

In the latch unit of FIG. 2, when the input signals are activated to 'high', the output of the NAND gate ND1 is latched at the NAND gates ND2 and ND3. Accordingly, the latch unit 40 maintains the output signal OUT to be 'high' until the wafer burn-in reset signal RESETB is input thereto.

FIG. 3 is a block diagram of a conventional circuit for a programmable stress test.

The conventional circuit for the programmable stress test includes a plurality of latch units 50 to 55, and a reset unit 56. The plurality of latch units 50 to 55 latch a programmable test signal TEST generated according to the test mode code which occurs when the programmable test mode is selected, mode select signals TRG1 to TRG6 setting respective different modes, and a reset signal TWLRSTB, to thereby output the test control signals TAWLT, TEWLT, TOWLT, T2RBET, T2RBOT, and TSAET. The reset signal TWLRSTB is a signal generated according to the test mode code which is generated when the programmable test mode is selected.

The reset unit 56 outputs the reset signal TWLRSTB in response to the programmable test signal TSET, a mode select signal TRG7, and a reset control signal TRSTPB.

The detailed structure of each latch unit 50 to 55 is identical to that of FIG. 2. That is, when the programmable test signal TSET and the mode select signal TRG1 to TRG6 are activated to 'high', the latch unit maintains the output signal OUT to be 'high' until the wafer burn-in reset signal RESETB is input thereto. When the reset control signal TRSTPB is activated, the output signal OUT becomes 'low'.

FIG. 4 is a circuit diagram of a conventional signal output unit 60.

The conventional signal output unit 60 includes a plurality of NOR gates NOR1 to NOR6, NAND gates ND4 and ND5, and a plurality of inverters IV3 to IV15. The signal output unit 60 performs a logic operation on the test control signals TAWLT, TEWLT, TOWLT, T2RBET, T2RBOT, and TSAET and the test control signals TAWLW, TEWLW, TOWLW, T2RBEW, T2RBOW, and TSAEW, so as to output predetermined output signals TEWL, TOWL, T2RBE, T2RBO, and TSAE.

In the conventional test mode controller, there are separately employed the wafer burn-in test circuit for controlling the wafer burn-in test mode operation, the programmable stress test circuit for controlling the programmable test mode operation, and the signal output unit 60 for combining the outputs of the wafer burn-in test circuit and the programmable stress test circuit. Therefore, an unnecessary circuit is used in the conventional test mode controller. The conventional test mode controller requires a large chip area, high current consumption, and limited operational speed.

SUMMARY OF THE INVENTION

It is, therefore, an object of the present invention to provide a test mode controller in which output signals of wafer burn-in test and programmable stress test circuits are output as one output signal through a circuit having a relatively simple structure, capable of reducing a chip area and unnecessary current consumption by integrally constructing latch units of the two test circuits.

In accordance with an aspect of the present invention, there is provided test mode controller including: a decoder for decoding a plurality of input signals activated in a wafer burn-in test to output a plurality of test mode setting signals; a plurality of latch units for latching the plurality of test mode setting signals in response to a plurality of mode select signals for selecting a test mode, a programmable test signal activated in a programmable stress test and a trigger signal, so as to output to a plurality of test control signals; and a signal output unit for performing logic operation on the plurality of test control signals to output predetermined output signals performing a test operation.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A test mode controller in accordance with exemplary embodiments of the present invention will be described in detail with reference to the accompanying drawings.

Figure 1:
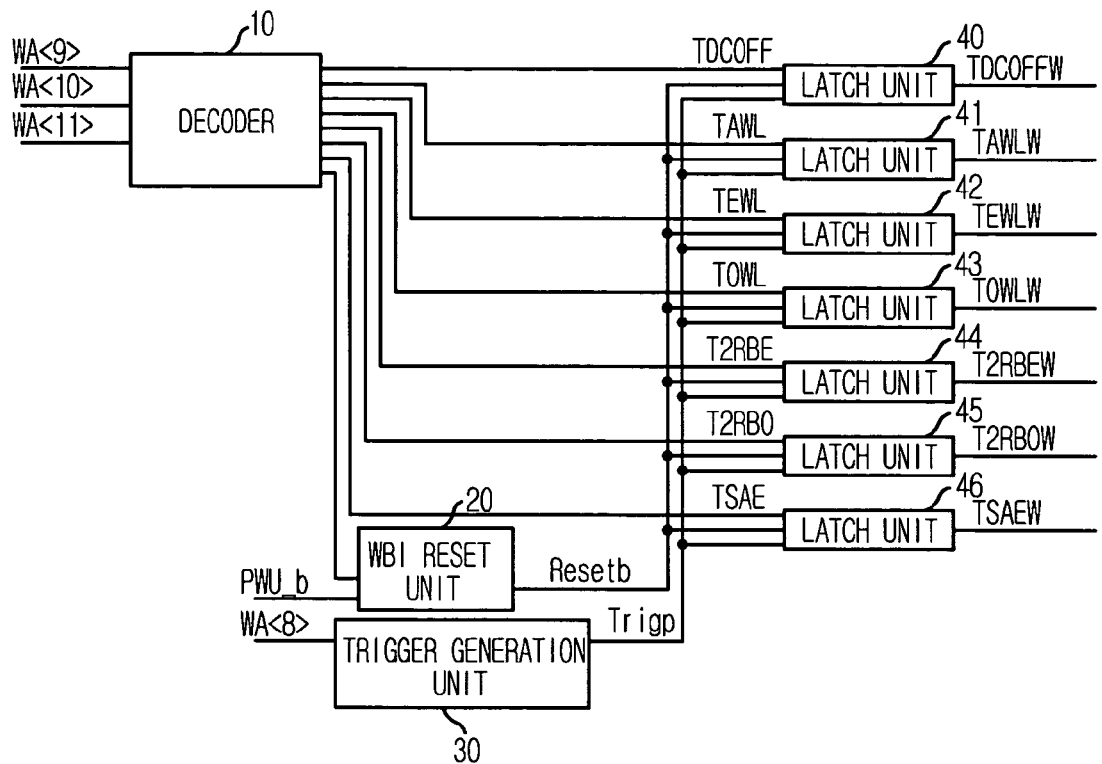
FIG. 1 is a block diagram of a conventional circuit for a wafer burn-in test.
Figure 2:
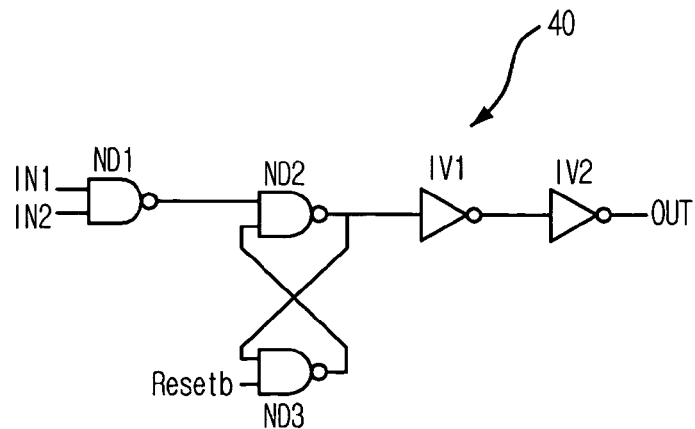
FIG. 2 is a circuit diagram of the latch unit of FIG. 1.
Figure 3:
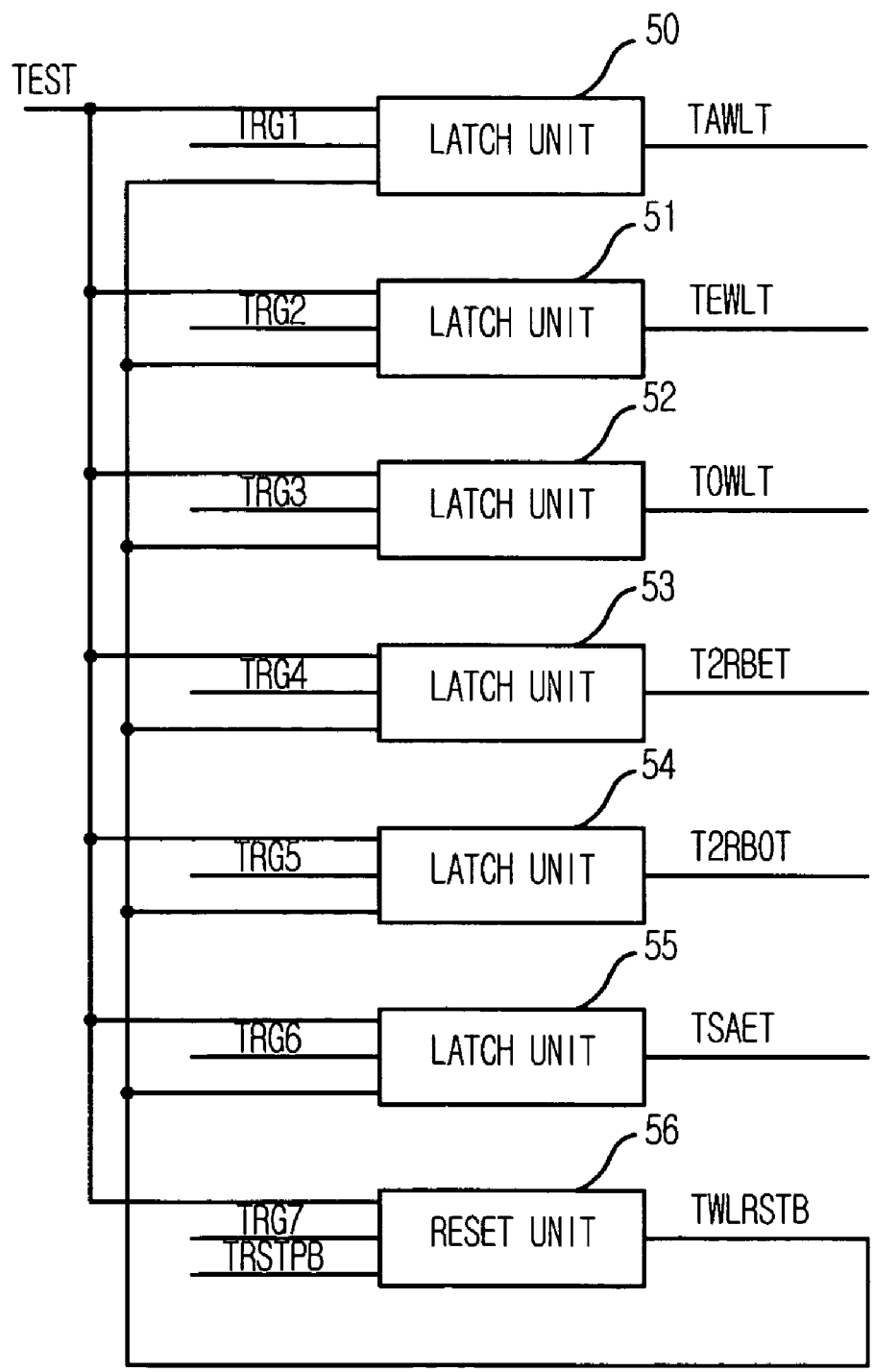
FIG. 3 is a block diagram of a conventional circuit for a programmable stress test.
Figure 4:
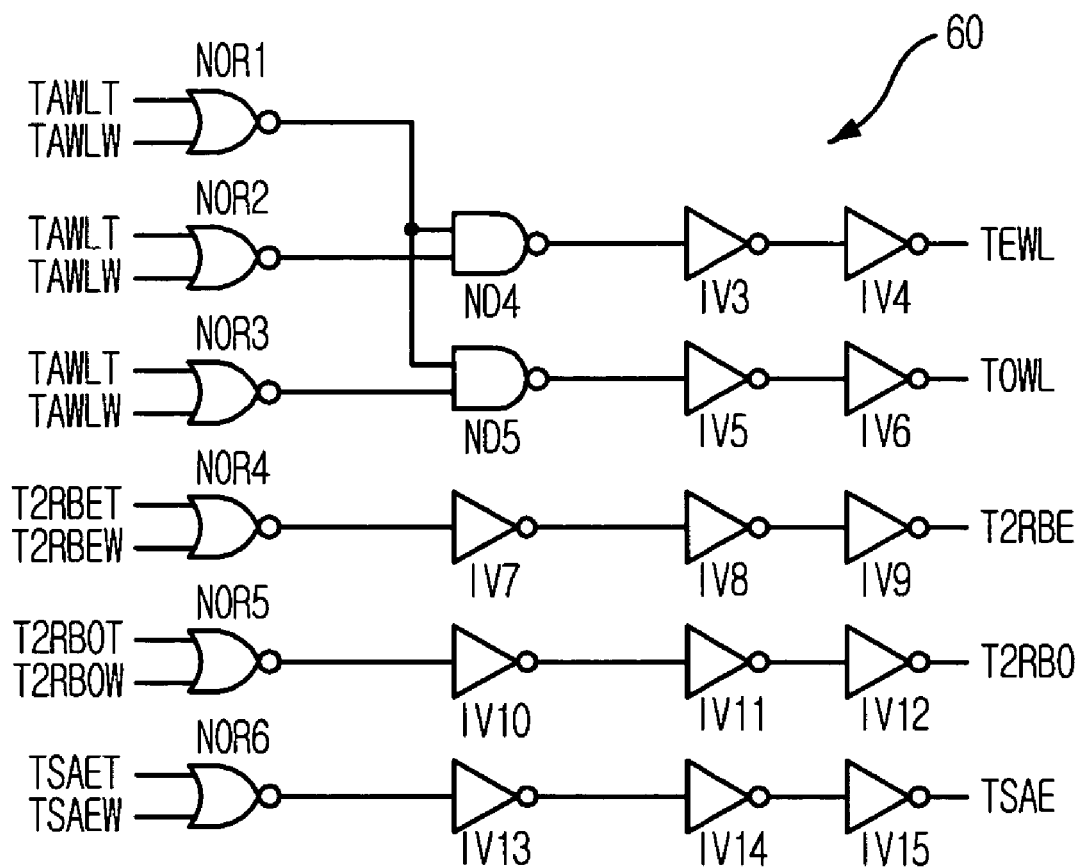
FIG. 4 is a circuit diagram of a conventional signal output unit.
Figure 5:
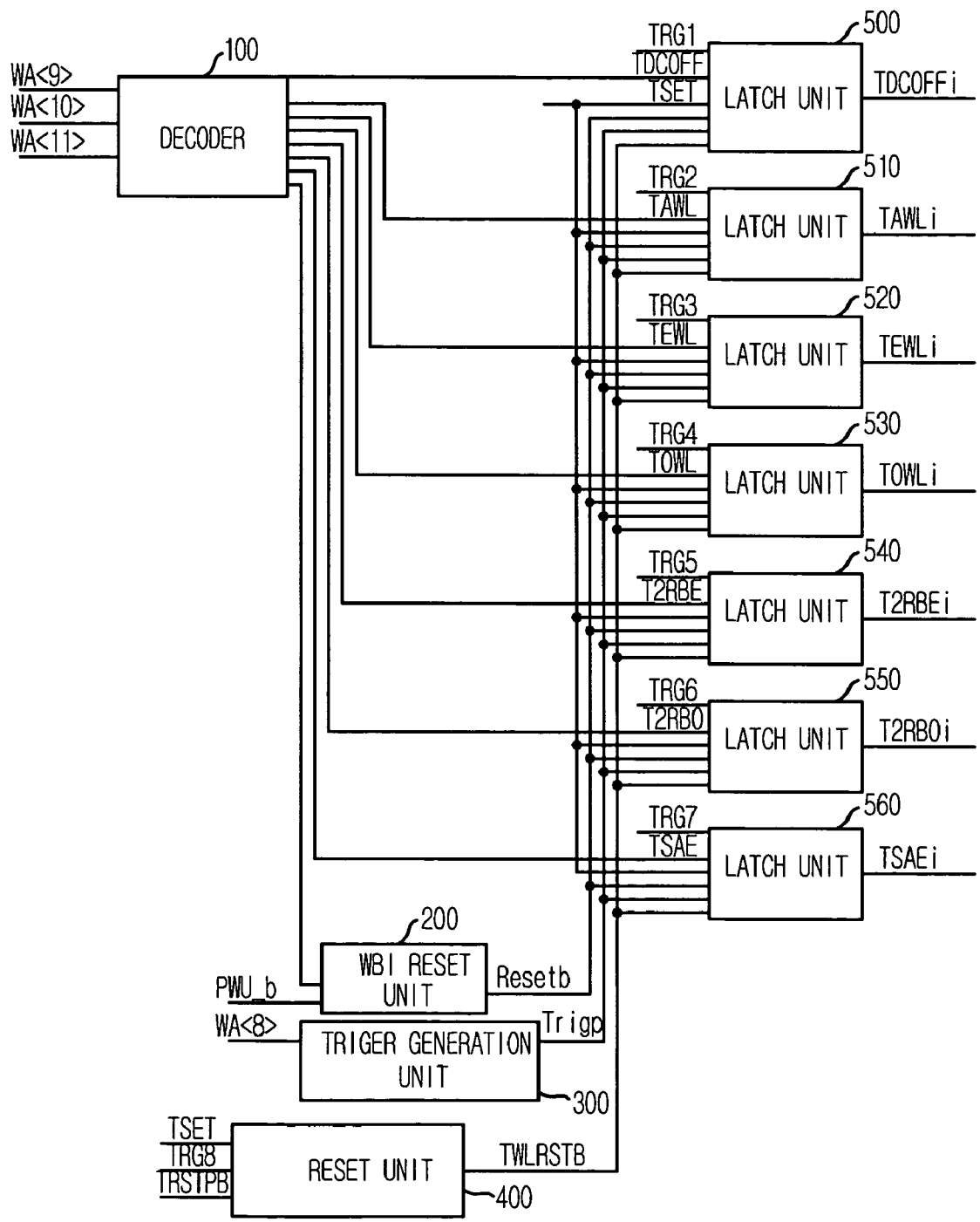
FIG. 5 is a block diagram of a test mode controller in accordance with the present invention.

FIG. 5 is a block diagram of a test mode controller in accordance with the present invention.

Referring to FIG. 5, the test mode controller of the present invention includes a decoder 100, a wafer burn-in (WBI) reset unit 200, a trigger generation unit 300, a reset unit 400 and a plurality of latch units 500 to 560.

The decoder 100 decodes input signals WA<9>, WA<10> and WA<11> activated in a wafer burn-in test so as to output test mode setting signals TDCOFF, TAWL, TEWL, TOWL, T2RBE, T2RBO and TSAE.

Herein, the test mode setting signal TAWL is a signal for testing all the word lines. The test mode setting signal TEWL is a signal for testing even-number of word lines (0, 2, 4, 6, . . . ), whereas the test mode setting signal TOWL is a signal for testing odd-number of word lines (0, 1, 3, 5, . . . ).

The test mode setting signals T2RBE and T2RBO are signals for enabling word lines in pairs, e.g., even-number of word lines in pairs (2, 3, 6, 7, . . . ) or even-number of word lines in pairs (0, 1, 4, 5, . . . ), respectively, by means of a 2RB pattern stress application method.

The WBI reset unit 200 outputs a wafer burn-in reset signal RESETB in response to the output of the decoder 100 or a power-up signal PWU_B of initial operation. The trigger generation unit 300 outputs a trigger signal TRIGP using a wafer burn-in code, i.e., an input signal WA<8>, as a wafer burn-in strobe signal.

The reset unit 400 outputs a reset signal TWLRSTB in response to a programmable test signal TSET, a mode select signal TRG8 for setting respective different modes, and a reset control signal TRSTPB, in which the programmable test signal TSET is generated according to a test mode code which is generated when the programmable test mode is selected. The reset signal TWLRSTB is a signal generated according to the test mode code which is generated when the programmable test mode is selected, and it is generated in response to the programmable test signal TSET, the mode select signal TRG8, and the reset control signal TRSTPB.

The plurality of latch units 500 to 560 latch the mode select signals TRG1 to TRG7, the test mode setting signals TDCOFF, TAWL, TEWL, TOWL, T2RBE, T2RBO, and TSAE, the programmable test signal TSET, the wafer burn-in reset signal RESETB, the trigger signal TRIGP, and the reset signal TWLRSTB, to thereby output test control signals TDCOFFI, TAWLI, TEWLI, TOWLI, T2RBEI, T2RBOI, and TSAEI, respectively.

The latch unit 500 latches the mode select signal TRG1, the test mode setting signal TDCOFF, the programmable test signal TSET, the wafer burn-in reset signal RESETB, the trigger signal TRIGP, and the reset signal TWLRSTB so as to output the test control signal TDCOFFI. The latch unit 510 latches the mode select signal TRG2, the test mode setting signal TAWL, the programmable test signal TSET, the wafer burn-in reset signal RESETB, the trigger signal TRIGP, and the reset signal TWLRSTB so as to output the test control signal TAWLI.

The latch unit 520 latches the mode select signal TRG3, the test mode setting signal TEWL, the programmable test signal TSET, the wafer burn-in reset signal RESETB, the trigger signal TRIGP, and the reset signal TWLRSTB so as to output the test control signal TEWLI. Likewise, the latch unit 530 latches the mode select signal TRG4, the test mode setting signal TOWL, the programmable test signal TSET, the wafer burn-in reset signal RESETB, the trigger signal TRIGP, and the reset signal TWLRSTB so as to output the test control signal TOWLI.

The latch unit 540 latches the mode select signal TRG5, the test mode setting signal T2RBE, the programmable test signal TSET, the wafer burn-in reset signal RESETB, the trigger signal TRIGP, and the reset signal TWLRSTB so as to output the test control signal T2RBEI. The latch unit 550 latches the mode select signal TRG6, the test mode setting signal T2RBO, the programmable test signal TSET, the wafer burn-in reset signal RESETB, the trigger signal TRIGP, and the reset signal TWLRSTB so as to output the test control signal T2RBOI.

Likewise, the latch unit 560 latches the mode select signal TRG7, the test mode setting signal TSAE, the programmable test signal TSET, the wafer burn-in reset signal RESETB, the trigger signal TRIGP, and the reset signal TWLRSTB so as to output the test control signal TSAEI.

Figure 6:
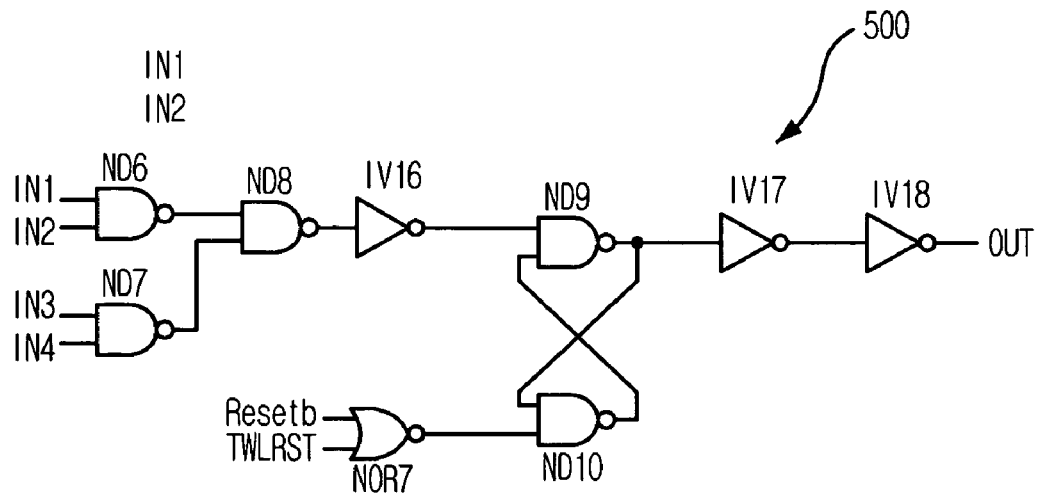
FIG. 6 is a circuit diagram of a latch unit of FIG. 5.

FIG. 6 is a circuit diagram of a latch unit of FIG. 5. Herein, the detail structures of the latch units 500 to 560 are identical to one another so the description will be focused on the structure of the latch unit 500 for example.

The latch unit 500 includes NAND gates ND6 to ND10, a NOR gate NOR7, and inverters INV6 to INV8. The NAND gate ND6 performs a NAND operation on input signals IN1 and IN2. The NAND gate ND7 performs a NAND operation on input signals IN3 and IN4. Herein, the input signals IN1 to IN4 means the test mode setting signal TDCOFF, the trigger signal TRIGP, the programmable test signal TSET, the mode select signal TRG6, respectively. The NAND gate ND8 performs a NAND operation on the outputs of the NAND gates ND6 and ND7.

The NAND gates ND9 and ND10 form a latch circuit. That is, the output of the NAND gate ND9 is input through one terminal of the other NAND gate ND10, and vice versa. The NAND gate ND9 performs a NAND operation on the output of the NAND gate ND8 which is inverted through the inverter INV6 and the output of the NAND gate ND10. The NOR gate NOR7 performs a NOR operation on the wafer burn-in reset signal RESETB and the inversion signal TWLRST of the reset signal TWLRSTB.

The NAND gate ND10 performs a NAND operation on the output of the NAND gate ND9 and the output of the NOR gate NOR7. The inverters IV8 and IV9 delay the output of the NAND gate ND9 to thereby output the output signal OUT. Herein, the output signal means the test control signal TDCOFFI.

Figure 7:
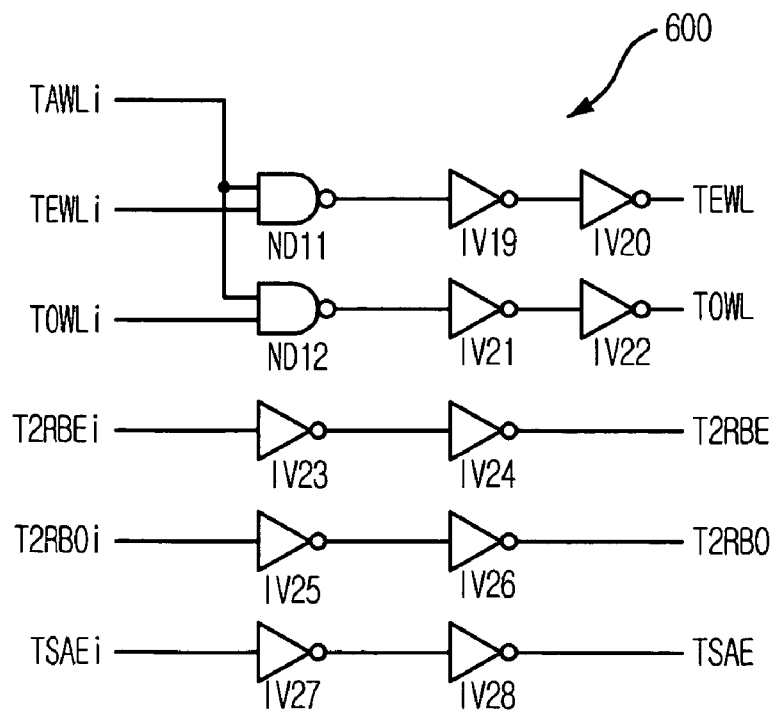
FIG. 7 is a circuit diagram of a signal output unit in accordance with the present invention.

FIG. 7 is a circuit diagram of a signal output unit 600 in accordance with the present invention.

The signal output unit 600 includes NAND gates ND11 and ND12, and a plurality of inverters IV19 to IV28. The signal output unit 600 performs a logic operation on the test control signals TAWLI, TEWLI, TOWLI, T2RBEI, T2RBOI, and TSAEI to output the output signals TEWL, TOWL, T2RBE, T2RBO, and TSAE.

The NAND gate ND11 performs logic NAND operation on the test control signals TAWLI and TEWLI. The NAND gate ND12 performs logic NAND operation on the test control signals TAWLI and TOWLI. The inverters IV19 and IV20 delay the output of the NAND gate ND11 to output the output signal TEWL. The inverters IV21 and IV22 delay the output of the NAND gate ND12 to output the output signal TOWL.

The inverters IV23 and IV24 delay the test control signal T2RBEI, to thereby output the output signal T2RBE. Likewise, the inverters IV25 and IV26 delay the test control signal T2RBOI so as to output the output signal T2RBO. The inverters IV27 and IV28 delay the test control signal TSAEI to output the output signal TSAE.

An operational mechanism of the test mode controller in accordance with the present invention will be set forth as followings.

In the inventive test mode controller, there are integrally formed the wafer burn-in test circuit for performing reliability test and the latch units 500 to 560 for performing the programmable stress test.

First, the decoder 100 decodes the input signals WA<9>, WA<10>, and WA<11> which are activated during the wafer burn-in test so as to output the test mode setting signals TDCOFF, TAWL, TEWL, TOWL, T2RBE, T2RBO, and TSAE to the respective latch units 500 to 560.

When both of the input signals IN1 and IN2, i.e., the test mode setting signal TDCOFF and the trigger signal TRIGP, are activated to 'high', the output signal OUT of the latch unit 500 becomes 'high'. In addition, when both of the input signals IN3 and IN4, i.e., the programmable test signal TSET and the mode select signal TRGn, are activated to 'high', the output signal OUT of the latch unit 500 becomes 'high'.

Since the other latch units 510 to 560 have the same structures as the latch unit 500, they latch the respective input signals to output the respective signals OUT.

In the inventive test mode controller, although only one of the wafer burn-in test mode and the programmable test mode is enabled, the latch unit 500 outputs the output signal OUT of logic high level. Accordingly, the output signal OUT is maintained to be 'high' until the activated wafer burn-in reset signal RESETB or the reset signal TWLRST is input.

When the power up signal PWU_B is activated, the wafer burn-in reset signal RESETB is activated according to the output of the decoder 100 for the wafer burn-in test, or the programmable stress reset signal TWLRST generated according to the test mode code is activated, the latch circuit of the latch unit 500 is reset.

The signal output unit 600 performs logic operation on the test control signals TDCOFFI, TAWLI, TEWLI, TOWLI, T2RBEI, T2RBOI, and TSAEI, which are applied from the respective latch units 500 to 560, to thereby generate the output signals TEWL, TOWL, T2RBE, T2RBO, and TSAE for controlling the test mode.

In the conventional test mode controller, two signals required for controlling the wafer burn-in test and the programmable stress test mode should be integrated as one signal via the NOR gate. However, in accordance with the present invention, the output signal, which has been already integrated at the integrally-constructed latch units 500 to 560, is applied to the signal output unit 600 and thereafter, each signal is output after buffering.

As described above, in accordance with the present invention, the output signals of the wafer burn-in test circuit and the programmable stress test circuit are output as one signal via the inventive circuit having a simple structure. Furthermore, the latch units of the two circuits are integrally formed so that it is possible to reduce the chip area and the current consumption, and to enhance the test speed.

The present application contains subject matter related to the Korean patent applications Nos. 10-2005-91660 and 10-2006-29650, filed in the Korean Patent Office on Sep. 29, 2005 and Mar. 31, 2006 respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A test mode controller, comprising:
   a test control block for determining whether a test mode is a programmable stress test or a wafer burn-in test to generate a reset signal in response to the determined test mode;
   a control signal generating block for receiving a plurality of input signals activated in the wafer burn-in test to generate a plurality of test control signals in response to the reset signal and the programmable test signal activated in a programmable stress test.

2. The test mode controller of claim 1, wherein the test control block includes a reset unit for outputting the reset signal in response to the programmable test signal generated according to a test mode code in the programmable stress test, a first mode select signal and a reset control signal.

3. The test mode controller of claim 1, wherein the control signal generating block includes:
   a decoder for decoding the plurality of input signals to output a plurality of test mode setting signals;
   a plurality of latch units for latching a plurality of test mode setting signals in response to a plurality of mode select signals for selecting a test mode, the programmable test signal and a trigger signal, so as to output to a plurality of test control signals;
   a wafer burn-in reset unit for outputting a wafer burn-in reset signal in response to the output of the decoder and a power up signal; and
   a trigger generation unit for outputting the trigger signal in response to a first input signal activated in the wafer burn-in test.

4. The test mode controller of claim 3, wherein the plurality of latch units output the corresponding activated test control signal among the plurality of test control signals when only one test between the wafer burn-in test and the programmable stress test is performed.

5. The test mode controller of claim 4, wherein the plurality of latch units maintain the test control signal at a 'high' logic level until the activated wafer burn-in reset signal or the reset signal is input.

6. The test mode controller of claim 3, wherein each of the plurality of latch units comprises a logic operation unit for performing logic operation on the plurality of mode select signals, the plurality of test mode setting signals, the programmable test signal, the wafer burn-in reset signal, the trigger signal and the reset signal to output the plurality of test control signals.

7. The test mode controller of claim 6, wherein the logic operation unit outputs the output signal of logic high level when the test mode setting signal and the trigger signal are activated to 'high' logic levels.

8. The test mode controller of claim 6, wherein the logic operation unit outputs the output signal of logic high level when the programmable test signal and the mode select signal are activated to 'high' logic levels.

9. The test mode controller of claim 6, wherein the output of the logic operation unit becomes logic low so that the logic operation unit is reset when the wafer burn-in reset signal or the reset signal is activated.

10. The test mode controller of claim 3, wherein each of the plurality of latch units comprises:
    a first NAND gate for performing a NAND operation on the test mode setting signal and the trigger signal;
    a second NAND gate for performing a NAND operation on the programmable test signal and the mode select signal;
    a third NAND gate for performing the outputs of the first and second NAND gates; a first inverter for inverting the output of the third NAND gate;
    a first NOR gate for performing a logic NOR operation on the wafer burn-in reset signal and the reset signal;
    a latch unit for latching the output of the first inverter and the output of the first NOR gate; and
    a first delay for delaying the output of the latch unit.

11. The test mode controller of claim 10, wherein the latch unit comprises a NAND gate latch.

12. The test mode controller of claim 1, further comprising a signal output unit for performing logic operation on the plurality of test control signals to output predetermined output signals performing a test operation.

13. The test mode controller of claim 12, wherein the signal output unit comprises:
    a first logic operation unit for performing logic operation on first to third test control signals among the plurality of test control signals to output first and second output signals; and
    a delay unit for delaying fourth to sixth test control signals among the plurality of test control signals to output third to fifth output signals.

14. The test mode controller of claim 13, wherein the first logic operation unit comprises:
    a fourth NAND gate for performing a logic NAND operation on the first test control signal and the second test control signal;
    a fifth NAND gate for performing a logic NAND operation on the first test control signal and the third test control signal;
    a second delay for delaying the output of the fourth NAND gate to output the first output signal; and
    a third delay for delaying the output of the fifth NAND gate to output the second output signal.

15. The test mode controller of claim 14, wherein the first output signal is a test signal for testing even-number of word lines.

16. The test mode controller of claim 14, wherein the second output signal is a test signal for testing odd-number of word lines.

17. The test mode controller of claim 13, wherein the delay unit comprises:
    a fourth delay for delaying the fourth test control signal to output the third output signal;
    a fifth delay for delaying the fifth test control signal to output the fourth output signal; and
    a sixth delay for delaying the sixth test control signal to output the fifth output signal.

18. The test mode controller of claim 17, wherein the third output signal is a test signal for testing even-number of word lines in pairs.

19. The test mode controller of claim 17, wherein the fourth output signal is a test signal for testing odd-number of word lines in pairs.

20. The test mode controller of claim 17, wherein the fifth output signal is a sense amplifier enable signal.

* * * * *